United States Patent [19]

Toggart et al.

[11] 4,305,204
[45] Dec. 15, 1981

[54] METHOD FOR MAKING DISPLAY DEVICE

[75] Inventors: Victor J. Toggart; Richard F. Kingsbury, both of San Jose; Robert O. Herendeen, Los Altos, all of Calif.

[73] Assignee: Litronix, Inc., Cupertino, Calif.

[21] Appl. No.: 112,505

[22] Filed: Jan. 16, 1980

[51] Int. Cl.³ .............................................. H05K 3/30
[52] U.S. Cl. ....................................... 29/841; 29/588; 29/846; 156/242
[58] Field of Search ................ 29/841, 846, 827, 588; 156/242, 99; 174/52 PE; 338/307, 314, 308; 357/72

[56] References Cited

U.S. PATENT DOCUMENTS

| | | | |
|---|---|---|---|
| 3,616,003 | 10/1971 | Kohashi et al. | 156/242 X |
| 3,622,419 | 11/1971 | London et al. | 29/827 X |
| 3,922,388 | 11/1975 | Schebalin | 338/308 X |
| 4,163,072 | 7/1979 | Soos | 357/72 X |

OTHER PUBLICATIONS

IBM Tech. Discl. Bull. vol. 12, No. 4, Sep. 1969, p. 594 by Pirog.

*Primary Examiner*—Francis S. Husar
*Assistant Examiner*—C. J. Arbes
*Attorney, Agent, or Firm*—Townsend and Townsend

[57] ABSTRACT

An alpha-numeric display device having a modular structure for placement side-by-side in vertical and horizontal formats to present symbols, words and phrases. The device functions as a stand-alone peripheral, appearing to a controller, such as a microprocessing device, as a random access memory. In particular, the device is operative to receive a standarized 7-bit ASCII code and to translate it to a multiple segment display whereby it can be continuously presented. The device provides a small, relatively low-cost alphabet and number display with a built-in electronic interface to a microprocessing unit permitting word communication to be incorporated into compact equipment, such as hand-held terminals and portable display devices. Complex interface circuitry is compactly packaged in a modular device by utilization of hybrid integrated circuit technology in which a multiple layer substrate provides interconnection between display units and semiconductor integrated circuit chips on opposing sides of the substrate. A multiple step PTF silkscreen printing process permits construction of a two-sided, compact display device with extremely thin, high resolution printed interconnections. The critical steps are the partial curing of a first application PTF dielectric composition followed by a second accurate application of PTF composition and subsequent curing thereof.

8 Claims, 5 Drawing Figures

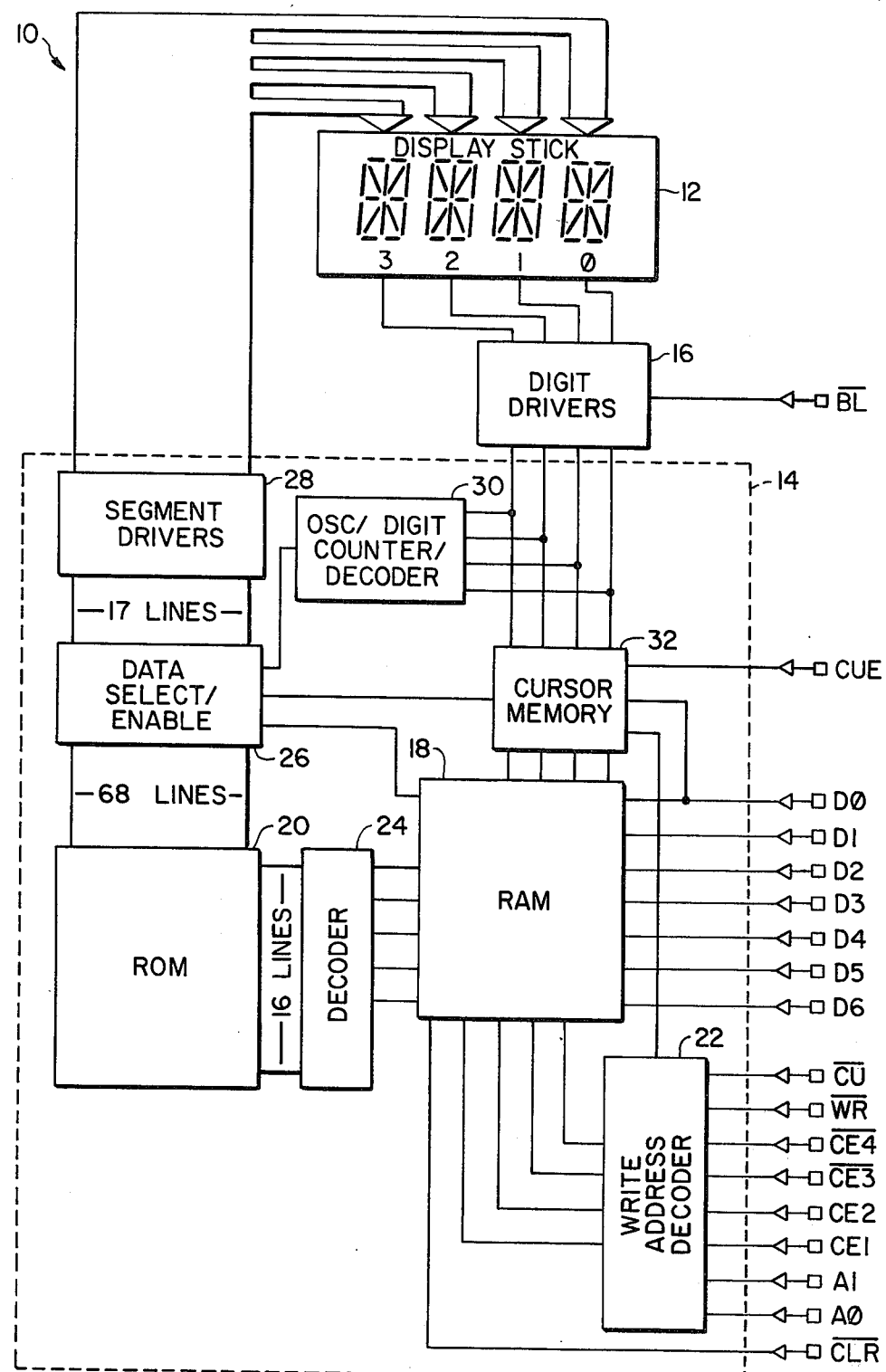
FIG._1.

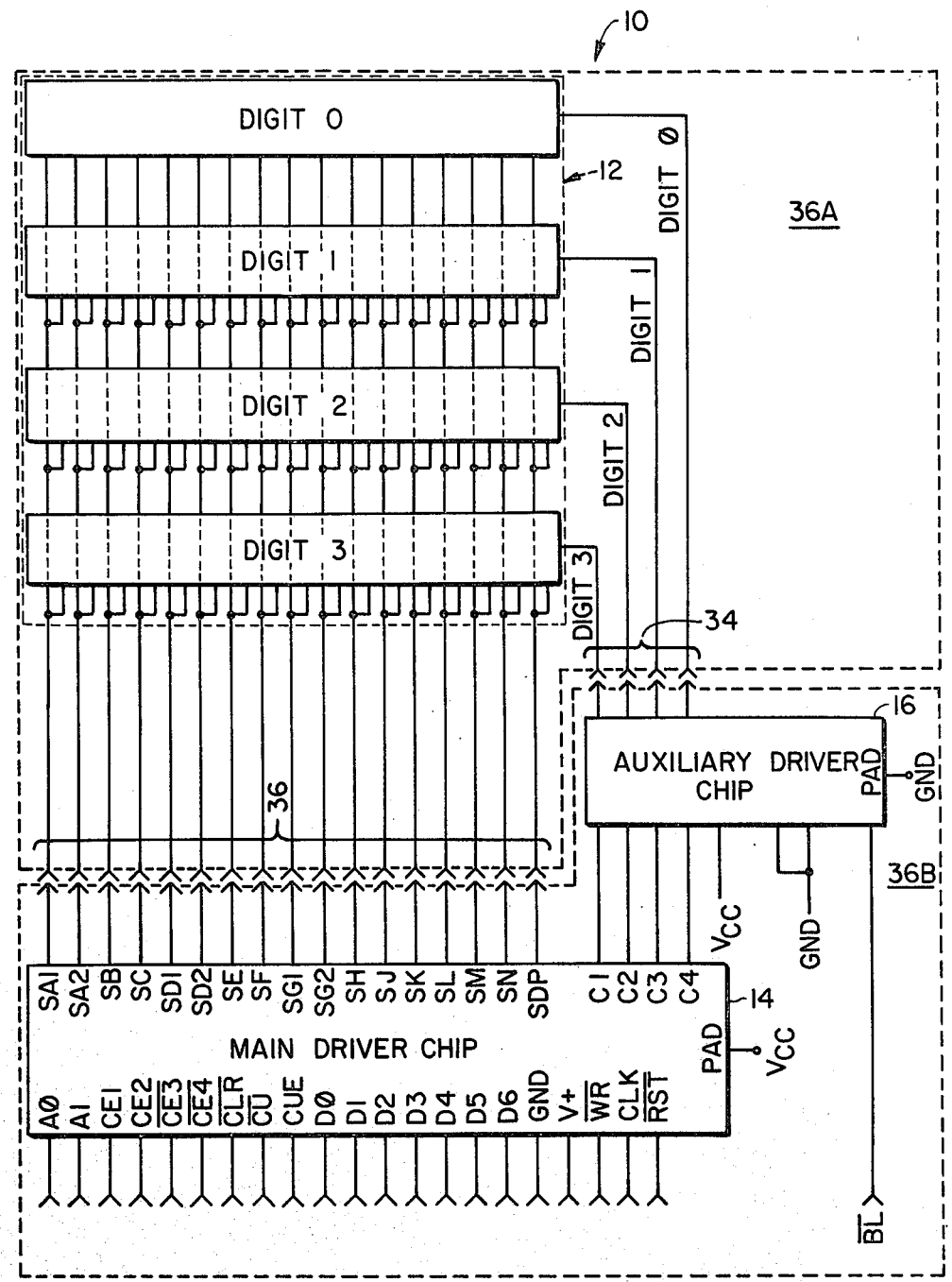
FIG._2.

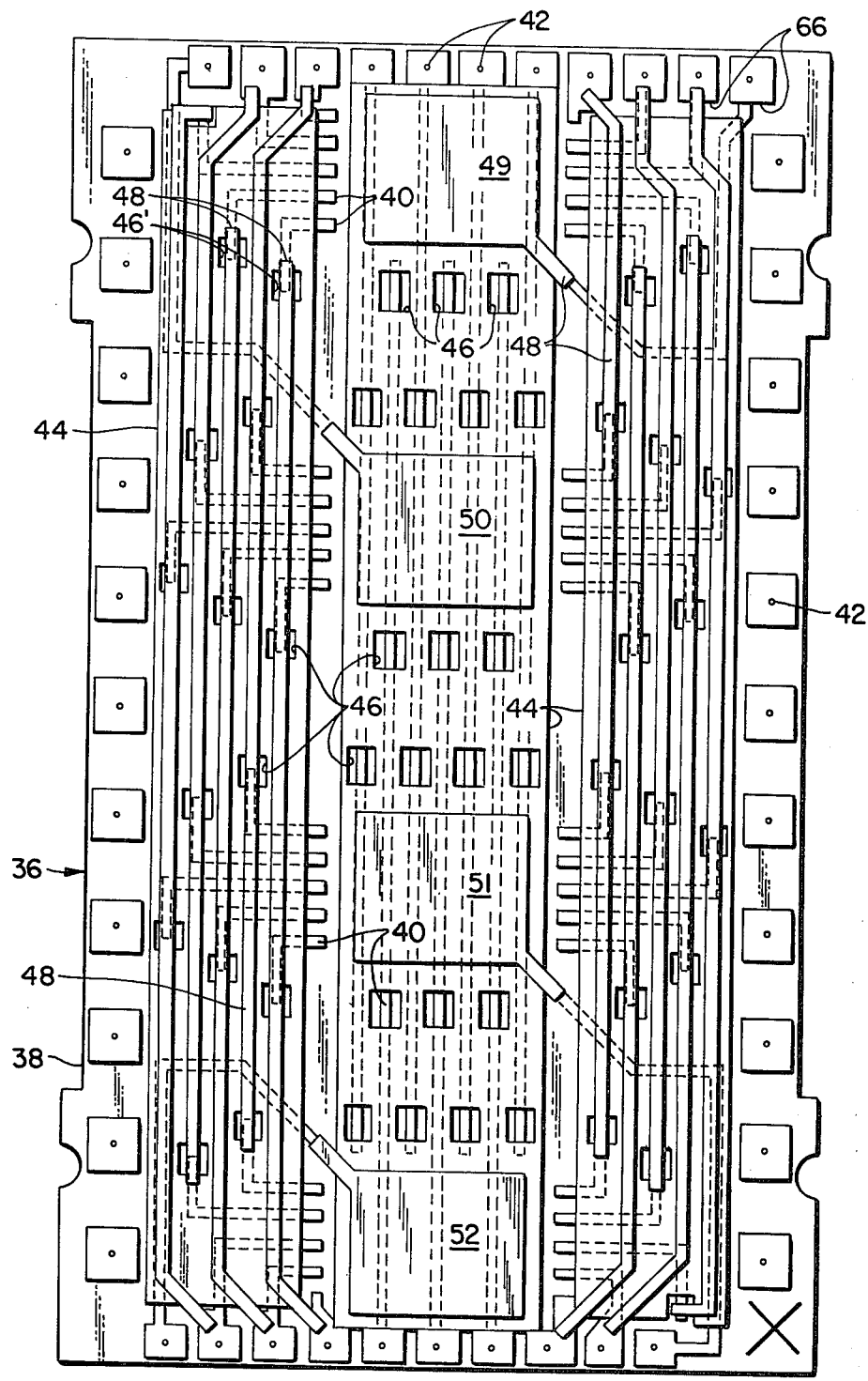
FIG._3.

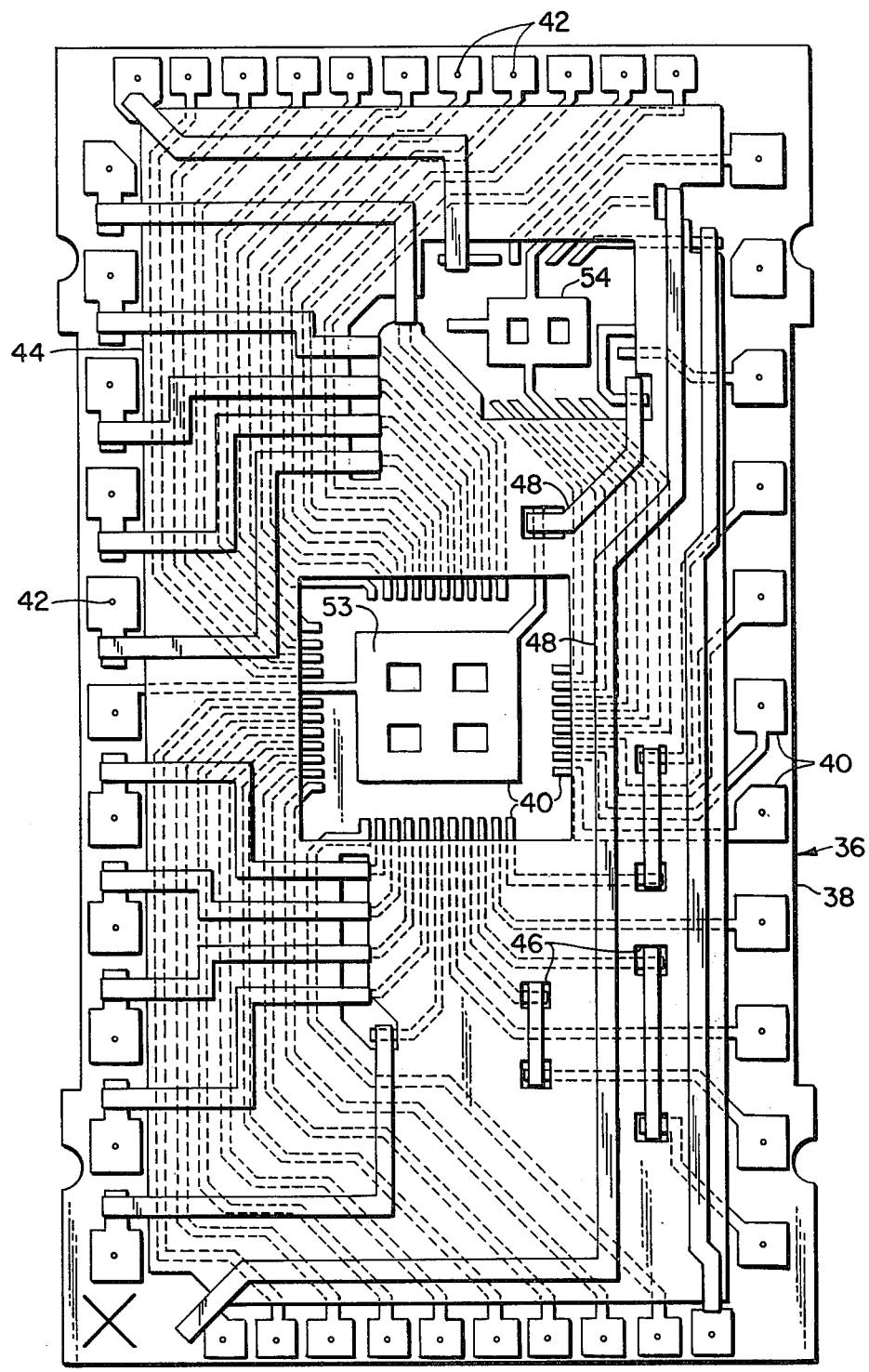
FIG._4.

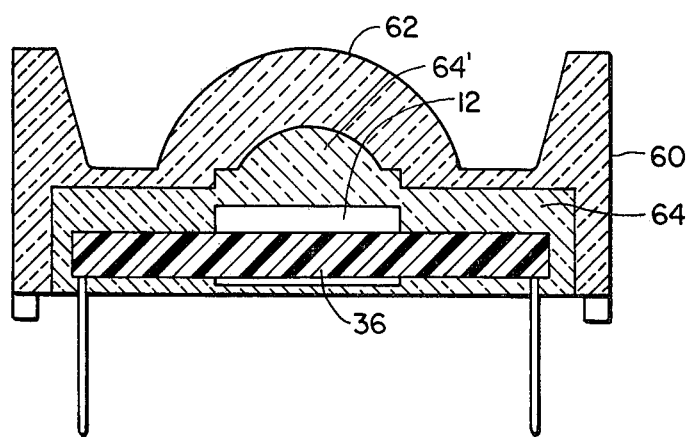
FIG._5.

METHOD FOR MAKING DISPLAY DEVICE

BACKGROUND OF THE INVENTION

Field of Invention

This invention relates to electro-optical displays and particularly to intelligent display devices as compact modular components for converting digital data into readable alpha-numeric characters. In particular, the invention relates to a method for fabricating miniature display devices as a double-sided multilayer printed circuit board using polymer thick film technology.

Devices of interest are modular components which convert digital data as from computers to readable alpha-numeric character sets. Complex presentations of words, sentences and even paragraphs can be provided with arrays of display devices while drastically reducing system costs and simplifying system design.

Heretofore arrays of complex display devices could only be employed where space was not at a premium. Relatively simple single layer copper covered and gold plated printed circuit board patterns have been employed to interconnect hybrid circuitry attached to the circuit board. The result was a planar component with a major portion of the display component side of the PC board devoted to support circuitry. As a consequence, complex display circuits could not be readily used in applications where size and spacing, particularly vertical spacing, were critical design parameters. Accordingly, a compact modular display device is needed which can be readily interfaced with a computing device such as a microprocessor and which will permit the display of discrete alpha-numeric characters closely adjacent one another in vertical and horizontal formats.

As used herein, polymer thick film technology relates to low temperature curing epoxy wherein the epoxy cures essentially without reaction with a substrate. By contrast, this technology is to be distinguished from ceramics technology wherein high temperature ink with a glass frit is screened onto a ceramic substrate at such a high temperature that an interaction is induced between the glass frit and the substrate in order to fuse the ink thereon.

The construction of polymer thick film (PTF) overlay circuitry in miniature device applications has created a number of problems including the problems of adherence between the conductor and the dielectric, blistering of the substrate, warping of the substrate, ink bleeding and imperfections in the thickness of the ink, particularly at margins of transition among overlying layers. The consequence has been short circuits between layers and circuit failure particularly where line width and line thickness approach limits imposed by surface tension.

PTF technology enables the overlay of conductors and dielectrics on a printed circuit board by a silkscreen printing process. There are two basic techniques for printing of dielectrics on a substrate. According to the first technique, first the dielectric can be screen printed on the substrate, cured, and reprinted and cured in the same pattern to cover pin holes which generally occur as a consequence of contamination. The print, cure, print process requires that the substrate be removed from the mask for curing and then subsequently be realigned. This process is necessarily slow and requires careful alignment to avoid unacceptable misalignment during the second printing step.

The second known technique for printing dielectrics on a substrate is to apply a pattern and then to reapply the same pattern without removing the substrate and mask from the alignment jig. This technique permits the production of relatively thinner material layers, and it eliminates most alignment problems. However, if a mask contains defects, the consequent impression imperfections remain even after the second application step. The primary problem, however, is bleeding of materials causing poor pattern definition.

The choice of dielectrics and conductors and the curing techniques are critical for achieving proper adherence between the dielectrics, the conductors and the substrate. In addition, the emulsion thickness of the mask and the mesh size of the mask are critical to proper adherence, resolution, and resistance to shock, stress, humidity and temperature.

In the past LED material has been encapsulated on a PC board by a direct casting process in which a high magnification lens was cast directly onto the substrate to cover the LED material die attached to the substrate. However, considerable difficulties were encountered because the mold used in the casting process, typically silicone rubber or polypropylene, deteriorated quickly and required frequent replacement.

Alternatively, high magnification lenses have been formed by injection molding whereby the lenses could be mass produced in a cleaner and easier process overcoming the problems of epoxy casting. However, lenses which have been injection molded do not provide good optical characteristics for viewing the character segments of the LED material when abutted thereto. Specifically, there are frequently voids between the segment material and the lens. The voids have an index of refraction significantly lower than that of the lens. The voids create optical problems, specifically inefficient illumination, distortion and limited viewing angle.

SUMMARY OF THE INVENTION

According to the invention, a method is provided for constructing an extremely small yet complex hybrid display device having a modular structure, such as a compact intelligent alpha-numeric display device, which can be placed side by side to display characters in both vertical and horizontal formats. The compact display device is able to display symbols, words and phrases in response to relatively simple standardized digital encoding from a controller such as a microprocessor device. The display device functions as a stand-alone peripheral appearing to its controller as a write-only Random Access Memory. In particular, the display device is operative to receive a standardized seven-bit ASCII code and to translate it into a multiple-segment display whereby it can be continuously presented in a format having less than one character height spacing between adjacent lines.

The device construction method comprises interconnection between the controller integrated circuits and display segments on opposing sides of a substrate by an extremely thin and high resolution multiple layer polymer thick film (PTF) dielectric and conductor pattern on both sides of the substrate. The multilayer pattern overlays a pattern of conductive material fused to the dielectric printed circuit (PC) board.

The PTF pattern printing process is a multiple step printing process involving partial intermediate cure and partial interim interpolymerization of consecutively printed extremely thin like layers of a printable composition, as hereinafter explained. As used herein, extremely thin means less than about 2.5 mils in thickness. The finished device is fully encapsulated by an injection molded plastic lens. Specifically, the printed circuit board with assembled integrated circuit is assembled by mating to a lens-forming capsule which is partially filled with clear liquid epoxy. The PC board is thereafter submersed in a clear liquid epoxy as if a casting were being made employing the lens-forming capsule as the die. All the voids between the display segments and the magnification lenses are thereby filled with clear epoxy. The injection molding process and subsequent casting process together eliminate mold deterioration and maximize the optical efficiency of the display segments as well as create a seal about the circuitry.

The extremely thin PTF silkscreen printing of high resolution conductive and dielectric materials is critical. Careful attention is required to substrate and materials, to processing temperature and time, and to screen emulsion thickness and screen mesh in order to avoid such problems as inadequate trace resolution and short circuits between layers. Moreover, multiple layer high density PTF circuitry requires careful circuit layout to minimize processing problems unique to high density PTF technology.

By careful attention to the details of circuit design, substrate processing and encapsulation, a reliable and relatively inexpensive display device is provided. The display devices can be used in data entry terminals, handheld calculators, panel displays such as in automobiles, digital clocks or radios, text editing typewriters, and in other devices where a relatively compact, low character count display can be used.

BRIEF DESCRIPTION OF THE DRAWINGS

The invention will be better understood by reference to the following detailed description taken in conjunction with the following drawings in which:

FIG. 1 is a block diagram of a display device according to the invention;

FIG. 2 is a schematic diagram of a device according to the invention showing the interconnection of six integrated circuits;

FIG. 3 is a plan view of a first side of a polymer thick film coated printed circuit board substrate;

FIG. 4 is a plan view of a second or reverse side of a polymer thick film coated printed circuit board substrate; and FIG. 5 is a side view of an encapsulating lens for a printed circuit board substrate.

DETAILED DESCRIPTION OF SPECIFIC EMBODIMENTS

A hybrid display device is a combination of many technologies including monolithic large-scale integrated circuit technology, monolithic light-emitting diode display technology, polymer thick film hybrid assembly technology, and plastic immersion optics technology. Referring first to FIG. 1, there is shown a block diagram of an intelligent display device 10 constructed according to the techniques of the invention. The display device 10 comprises a four digit display stick 12 having a seventeen segment font and driver circuitry constructed according to CMOS LSI integrated circuit techniques. In the specific embodiment described, the driver circuitry comprises a main driver chip 14 and an auxiliary chip 16 as hereafter explained. The main driver chip includes a Random Access Memory (RAM) 18, a Read Only Memory (ROM) 20, character multiplexing circuitry, and segment drivers. The auxiliary chip 16 comprises digit drivers.

The multiplexing circuitry comprises a write address decoder 22 coupled between input address control terminals and the Random Access Memory 18, a decoder 24 coupled between the output of the RAM and the input of the ROM 20, data select/enable control 26 coupled between the output of the ROM 20 and input lines to segment drivers 28. An oscillator/digit counter/decoder circuit 30 is coupled to the data select/enable circuit 26 and to the input lines of the digit drivers of auxiliary chip 16 to provide synchronous control signals. A cursor memory 32 is provided which is coupled to the data select/enable circuit 26 and to the digital drivers of auxiliary chip 16 as well as to the RAM 18. The cursor memory 32 is operative in one state to convey drive signals from the RAM 18 to the digit drivers and in another state to override the output signals of the RAM 18 to produce a cursor at the selected segment in response to an external control signal.

The ROM 20 includes a table for converting a standard input character code to a character display. For example, if the ROM 20 is encoded with an ASCII code, a character input through detector 24 will generate the correct signals for displaying a character. The operation of the binary input lines is instructive. Lines labeled D0 through D6 are data input lines of a standard code such as ASCII. The $\overline{WR}$ is the write input which must be held low to write data into the RAM 18 or the cursor memory 32. Terminals A0 and A1 are binary address input lines. $\overline{CU}$ is the cursor input which must be held high to store data in the RAM 18 and low to store data in the cursor memory 32. CUE is a cursor function which is enabled when the line is high or disconnected. The control $\overline{CLR}$ coupled to the RAM 18 is operative to clear the RAM when held low. The input labeled $\overline{BL}$ coupled to the digit drivers of auxiliary chip 16 is operative to turn off all segments without affecting the contents of the RAM 18 or cursor memory 32.

The display device 10 assembled in a system with the data bus connected to the data lines, the address bus coupled to the address lines, and control signals coupled at the appropriate control inputs, operates in a manner similar to a RAM. Multiplexed display systems sequentially read and display data from a memory device. In synchronous systems, control circuitry must compare the location of data to be read and displayed to the location of new data to be stored, that is, to synchronize the data before a write operation can be performed. In the intelligent display as herein described, data entry may be asynchronous, and it can be stored in a random order. Each digit or character reproduced in the display stick 12 remains until replaced by another digit or character. A cursor function, however, is provided which causes all segments of a digit to illuminate. The cursor function may indicate the position in the display of the next character to be entered. The cursor overrides display of a stored character and is itself not a character. Upon removal of the cursor signal CUE, the display stick 12 will again show the character stored in the RAM 18.

Turning now to FIG. 2, there is shown a schematic diagram of a specific display device 10 according to the invention. All subsystems are shown. The display stick 12 comprises four digit segments 0, 1, 2, and 3 mounted on first face A of a circuit board 36A. The main driver chip 14 and auxiliary driver chip 16 are mounted on the back side B of the circuit board 36B. Coupling between opposing faces of the circuit board are typically made at feedthrough points 34, 36 through the substrate circuit board. The feedthrough points are preferably away from the edge of the circuit board, but they may be near the edge, depending upon space constraints.

The digits of the display stick 12 are typically monolithic galium arsenide phosphide segments disposed in a standard font format. The auxiliary driver chip 16 is a type LBC 1191 silicon-based monolithic IC manufactured by Litronix, Inc. of Cupertino, Cal., and the main driver chip is type LMC 262X monolithic IC also manufactured by Litronix, Inc. of Cupertino, Cal. Both the main driver chip 14 and the auxiliary driver chip 16 are especially adapted for hybrid mounting. Techniques are not yet available for fully integrating a visible display with associated monolithic driver circuitry. Even if it were possible to provide a visible display monolithic circuit device, the size required for comfortable viewing suggests that it would be unacceptably expensive.

A PTF technology-based hybrid device is preferred because the materials are inexpensive, rugged and are characterized by a close match of the coefficients of thermal expansion. Consequently a hybrid device of the chosen design exhibits good long-term reliability in a harsh environment.

Referring now to FIGS. 3 and 4, the respective sides of a specific two-sided PTF circuit board 36 are shown. FIG. 3 illustrates side A, the front side of the board 36A, and FIG. 2 illustrates side B, the rear side of the board 36B.

The two-sided circuit board 36A, 36B comprises an epoxy substrate 38, preferably a high temperature type, with one-quarter-ounce copper base material 40 which is gold-plated. The base material 40 is laid out in a first conductive pattern by standard photoresist etching techniques. Pads are provided along the long margins of the board 36 for connection to external devices. Pads along the short margins are reserved for feedthrough connections to the opposing side of the board. All pads are perforated with holes 42 which are plated through to assure good electrical connection between pads on opposing sides of the substrate 38.

In order to construct a multilayered device, a dielectric polymer thick film (PTF) 44 is silkscreened over the substrate 36 in order to cover all base material 40 traces which require insulation. Voids 46 are provided where connections are to be made through the PTF screen, as for example for wire bonding or for a conductive overlay.

Thereafter, a conductive PTF composition 48, such as a PTF silver composition, is silkscreened over the dielectric PTF 44, and particularly over selected open areas of the dielectric PTF 44 exposing traces of the base material 40 and thereby establishing an electrically conductive connection between the base material 40 and the overlying conductive composition 48.

With particular attention to FIG. 3, the conductive PTF composition 48 is silkscreened over the PTF dielectric 44 to provide a conductive pad for attachment of the character display units (not shown), either as segments or as premounted devices, with the conductive traces for the display units passing directly under the composition pads therefor. The voids 46 and the dielectric 44 on each side of the display segment pads 49, 50 are sufficiently broad to permit wire bonding between the underlying conductive material 40 traces and display segments dibonded to the composition 48 pads 49 through 52. While the monolithic displays are diattached to the conductive composition 48 pads, the driver circuitry (not shown) is diattached directly to pads 53, 54 (FIG. 4) of the base material 40.

According to the invention, the intermediate insulative layer is a minimal thickness one component, screen printable PTF dielectric material having a thixotropic rheology and a viscosity of about 70,000 to 125,000 CPS at room temperature. It is emplaced in multiple layers on the substrate in the following manner. A first minimal thickness layer of silkscreen dielectric is screen printed over the base material on the substrate through a mask which is free of any solvent or solvent residue and which has an emulsion thickness of between about 1.5 mils and 2 mils (0.04 mm and 0.05 mm) and a mesh of 200–325. Thereafter, the dielectric is only partially cured, at least to a point of solvent resistance. The cure temperature should not exceed the critical temperature of the substrate, and the temperature should be maintained for a time longer than is required for solvent resistance but less than is required for 100 percent polymerization. Partial curing is effected at a temperature of not more than about 150° C. and for a time of at least twelve minutes but not more than about twenty-five minutes. The minimum partial curing time for the first layer is about fifty minutes at a temperature of about 120° C. (It has been observed that the cure temperature should not be less than about 120° C. for one component thixotropic epoxies. The minimum temperature is observed to be a material transition temperature. One component dielectric epoxy cured at less than 120° C. has been observed to lead to dielectric failure when subjected to temperature cycling.)

After the first dielectric layer has been printed and partially cured, as outlined above, a second layer of dielectric material is printed over the first layer before the printing mask is removed from its alignment jig. In this manner, the second layer is aligned exactly with the first layer. Thereafter, the device with the double printed dielectric is fully cured. A temperature in the range of not more than the critical temperature of the substrate (about 150° C.) and for a time of not less than that required to achieve a standard hardness (approaching 100 percent polymerization) is the final step with respect to the dielectric (generally about 30 minutes). Full cure is believed to cause interpolymerization of the two dielectric layers so that small defects are corrected by slight migration between layers during the curing process.

The overlying layer, a conductive composition, may be printed in the same manner, although its processing is less critical because only the intermediate dielectric layer must be flawless to protect against short circuit failure. The curing temperature is critical and should be at or below the manufacturer's specified critical temperature of the substrate (about 150° C. for low temperature subtrates). Curing at or slightly below the critical temperature of the substrate eliminates substrate wrap, outgassing and blistering. Moreover, the double printing and curing process substantially eliminates pinholes which can cause short circuits, and it assures good adhesion between the dielectric layer and both the underlying substrate and overlying conductor layer. The cure time for the conductive composition is on the order of 180 minutes at the maximum temperature.

The initial layers of dielectric material are subjected to a considerably longer cure time than the last printed dielectric layers due to the cumulative effect of the multiple-step curing process. The last dielectric layer is cured at least 40 minutes prior to screen printing of the last conductive layer. The last conductive layer is cured, as has been mentioned, at least 180 minutes, so that the cumulative cure time of the last dielectric layer is 220 minutes. The cure times for the previous layers exceed this minimum. The relatively longer cure times have not been observed to be detrimental.

One of the probable reasons the double screen printing process with partial intermediate cure described above is successful seems to lie in the resultant thickness of the printed trace. The process described above produces a thinner, more pliable and higher resolution trace than other known processes.

An important factor contributing to proper adhesion and uniform trace cross-over of the base material in a multilayer board is the thickness of the base material. To this end, the epoxy PC board is preferably a type quarter-ounce copper board with gold-plated tracings. The trace thickness of a quarter-ounce board is approximately 1.5 mils (0.04 mm). It has been found for example that one-half-ounce type copper board has such a substantial trace thickness that extremely thin dielectric and conductor type polymer thick film trace cross-overs of the type described herein frequently fail at the cross-over point. The stock quarter-ounce copper board base material has been found to be most satisfactory. However, the base material may vary in weight rating by as much as one-sixteenth-ounce without noticeable degradation.

The preferred choice of materials for the dielectric material is Engelhard Type A3888 one component screen printable polymer dielectric composition manufactured by Engelhard Industries Division of Engelhard Minerals and Chemicals Corporation, East Newark, N.J. Other possibly suitable dielectric materials may be manufactured by Electro Science Laboratories, Inc. of Pennsauken, N.J., and Electro Materials Corporation of America of Maroneck, N.Y. The dielectric epoxy is often designated a screen printable organic encapsulant.

An appropriate conductive adhesive silver composition compatible with the noted Engelhard composition is Electro Science Laboratories Type 1110-S silver composition. It is a thixotropic, single component, screen printable epoxy with a viscosity of 125,000 to 170,000 CPS at 26° C. Its minimum recommended cure time at 150° C. is 120 to 180 minutes.

A suitable substrate is a laminated board of a grade of at least FR-4 (as designated by the Association of Circuit Manufacturers).

Tests have been performed to determine the minimum time for extremely thin screen printed dielectric traces to achieve a condition of observable resistance to solvent attack. Traces were printed as outlined above on substrates. The substrates were then placed in an oven at a constant temperature and cured at the oven temperature. Below in Table I entitled "Time to Obtain Solvent Resistance" is a summary of the results of the curing tests.

TABLE I

| Time to Obtain Solvent Resistance | | |
|---|---|---|
| Cure Temperature (°C.) | Time for Dielectric Traces (min.) | Time for Conductive Traces (min.) |
| 120 | 50 | 80 |
| 130 | 30 | 70 |
| 140 | 20 | 60 |

TABLE I-continued

| Time to Obtain Solvent Resistance | | |
|---|---|---|
| Cure Temperature (°C.) | Time for Dielectric Traces (min.) | Time for Conductive Traces (min.) |
| 150 | 12 | 60 |

A maximum time for partial cure for the initial layer is not of particular interest, since it is desired to achieve a partial cure threshold only. Substantial polymerization of the initial layer prior to application of the second layer is believed to inhibit interpolymerization of layers and present problems of adhesion.

Other problems have been discovered in the course of developing a high resolution polymer thick film silkscreening process. First of all, it has been discovered that the liquid dielectric before and during cure tends to flow along the margin of underlying traces. Second, it has been discovered that cross-overs tend to fail and develop voids along cross-over margins under certain conditions. The conditions have been discovered to be attributable to flow characteristics of PTF inks, inherent characteristics of screen emulsions, and the particular requirements of high resolution and reliability of trace cross-overs.

In order to overcome the problem of undesired ink flow, in accordance with the invention the size of openings in the dielectric at selected connector points is made substantially larger than the size of the connector, overlying traces are extended well beyond corresponding margins of underlying traces so that they never coterminate, and underlying traces are flared in a manner to provide a sharp margin on the substrate surface. In order to overcome the problem of dielectric failure, the dielectric cross-over is extended to at least the opposite margin of the underlying trace. This assures adequate dielectric cover without backflow or loss of dielectric along the cross-over margin of a trace. Examples of these innovations are illustrated in FIGS. 3 and 4.

Referring to FIG. 3, it is seen for example, that conductor traces 48 extend past the opening 46 in the dielectric 44 in order that there be established a good contact with underlying conductive traces 40, that the openings 46 are substantially larger than the width of underlying traces 46, and that the openings never coterminate with underlying traces 40 or overlying traces 48. Finally the pads 66 of the respective feedthroughs are flared to provide an abrupt margin at the edge facing toward the dielectric 44 edge.

Cleanliness has been found to be critical to reliable high resolution silkscreen printing. Residues of cleaning solvents have been discovered to be a principal source of device failure causing loss of adhesion and inaccuracies in printing. Therefore, polymer solvent should be used only infrequently, and when used, the residue of the polymer solvent must be thoroughly rinsed out of the silkscreen mesh with a solvent for the polymer solvent, since any residue on the silkscreen mesh interferes with proper adhesion of the polymer to the underlying substrate.

After completion of the electrical structure it is necessary to provide a suitable mechanical housing for the device. To this end, the electrical structure and completed circuit are encapsulated in an injection molded transparent shell 60 (FIG. 5) forming on one side thereof a lens 62 abutting to the display stick 12 mounted on the circuit board 36. The shell 60 forming the lens 62 is first partially filled with clear liquid epoxy 64', the finished printed circuit board is set in the shell, and the shell is then filled with clear liquid epoxy 64 such that the shell 60 and the circuit board 36 act as a mold. All voids between the display segments of the display stick 12 and the lens 62 are eliminated by the clear liquid epoxy 64. The process by which this device is manufactured provides for a fully encapsulated display device constructed in accordance with low-cost injection molding processes yet having the optical advantage of a casting fused with the character display segments.

The invention has now been explained with reference to specific embodiments. Variations on the specific embodiments will be apparent to those of ordinary skill in the art in light of this description. It is therefore not intended that this invention be limited except as indicated by the appended claims.

What is claimed is:

1. A method for constructing a hybrid polymer thick film compact substantially planar circuit apparatus comprising the steps of:

providing a planar epoxy substrate with an electrically conductive base material for defining an underlying trace pattern;

silkscreening a minimal thickness polymer thick film dielectric insulative composition layer at selected locations on a face of said substrate over portions of said trace pattern;

thereafter partially curing said first dielectric insulative layer sufficient to obtain solvent resistance;

thereafter silkscreening exactly over the first dielectric insulative layer a second minimal thickness dielectric insulative composition layer;

thereafter substantially curing the resultant dielectric insulative composition layers;

thereafter silkscreening an electrically conductive composition in a desired trace pattern over the dielectric insulative composition; and thereafter substantially fully curing the resultant electrically conductive and dielectric insulative composition layers.

2. The method as claimed in claim 1 wherein said minimal layer silkscreening steps comprise printing through a mask having a thickness of between about 1.5 mils and about 2 mils and a mesh of between about 200 and about 325 which mask is substantially free of solvent residue.

3. The method as claimed in claim 1 wherein said partial curing step comprises heat treatment at a temperature of not more than the critical temperature of the substrate material for a time not substantially longer than is required for the material to obtain solvent resistance.

4. The method as claimed in claim 3 wherein the dielectric insulative composition is a single component thixotropic epoxy material having a viscosity of between 70,000 and 125,000 CPS at room temperature and wherein said heat treatment temperature is not less than 120° C. for a time of not less than 12 minutes.

5. The method as claimed in claim 1 further including the steps of:

diattaching integrated circuit devices at selected locations over the substrate and said compositions;

mounting the substrate with diattached circuit devices in a clear casing forming on one side thereof at least one lens, said lens confronting optical radiation elements of said circuit devices; and filling the casing with clear liquid epoxy to eliminate all voids between the lens and the substrate to fully encapsulate the circuit devices with selected portions in intimate optical contact with said lens.

6. The method as claimed in claim 5 further comprising partially filling said casing with clear liquid epoxy prior to mounting the substrate in the clear casing.

7. The method as claimed in claim 1 wherein said first dielectric insulative composition silkscreening step includes the provision of margins and openings which are not coterminus with underlying layers.

8. The method as claimed in claim 7 wherein said conductive composition silkscreening step includes the provision of terminations substantially extended beyond the area of interconnection with abutting conductive traces.

* * * * *